United States Patent
Assel et al.

(10) Patent No.: US 11,694,759 B2
(45) Date of Patent: Jul. 4, 2023

(54) METHOD FOR THE SECURED STORING OF A DATA ELEMENT OF A PREDEFINED DATA TYPE TO BE STORED BY A COMPUTER PROGRAM IN AN EXTERNAL MEMORY

(71) Applicant: Robert Bosch GmbH, Stuttgart (DE)

(72) Inventors: Martin Assel, Markgroeningen (DE); Axel Aue, Korntal-Muenchingen (DE); Matthias Schreiber, Vaihngen/Enz (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 17/318,394

(22) Filed: May 12, 2021

(65) Prior Publication Data

US 2022/0028474 A1  Jan. 27, 2022

(30) Foreign Application Priority Data

Jul. 21, 2020 (DE) .......................... 102020209132.3

(51) Int. Cl.
*G11C 29/42* (2006.01)
*G11C 29/16* (2006.01)
(Continued)

(52) U.S. Cl.
CPC .............. *G11C 29/42* (2013.01); *G11C 29/16* (2013.01); *G11C 29/44* (2013.01); *G11C 2029/4002* (2013.01)

(58) Field of Classification Search
None
See application file for complete search history.

(56) References Cited

U.S. PATENT DOCUMENTS 9,691,505 B2 * 6/2017 Das .......................... G06F 3/064

FOREIGN PATENT DOCUMENTS

DE  102007033746 A1 * 4/2008 .......... G06F 11/1016

OTHER PUBLICATIONS

"Cartwright", "Elements of Object-Oriented Program Design"—(2009)—(Rice University) (Year: 2009).*

(Continued)

*Primary Examiner* — April Y Blair
*Assistant Examiner* — Matthew W Wahlin
(74) *Attorney, Agent, or Firm* — Norton Rose Fulbright US LLP; Gerard Messina

(57) ABSTRACT

A method for the secured storing of a data element of a predefined data type to be stored by a computer program in an external memory, which is connected to a microcontroller, an error correction value of one error correction value data type being used. The method includes, when creating the computer program: defining a composite data element that includes one element of the data type and one element of the error correction value data type, in the computer program; and when executing the computer program: calculating the error correction value for the data element to be stored; forming an error correction data element as the composite data element, which contains the data element to be stored and the associated error correction value, which has been calculated for the data element; and writing the error correction data element to a memory address for the error correction data element.

9 Claims, 2 Drawing Sheets

(51) Int. Cl.
*G11C 29/44* (2006.01)
*G11C 29/40* (2006.01)

(56) References Cited

OTHER PUBLICATIONS

"Charles", "How To Calculate a DynamoDB Items Size"—(Jan. 5, 2019)—URL:https://zaccharles.medium.com/calculating-a-dynamodb-items-size-and-consumed-capacity-d1728942eb7c (Year: 2019).*

* cited by examiner

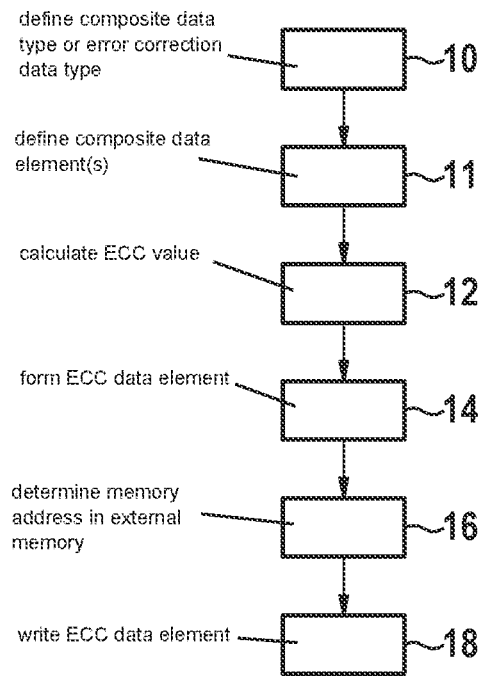
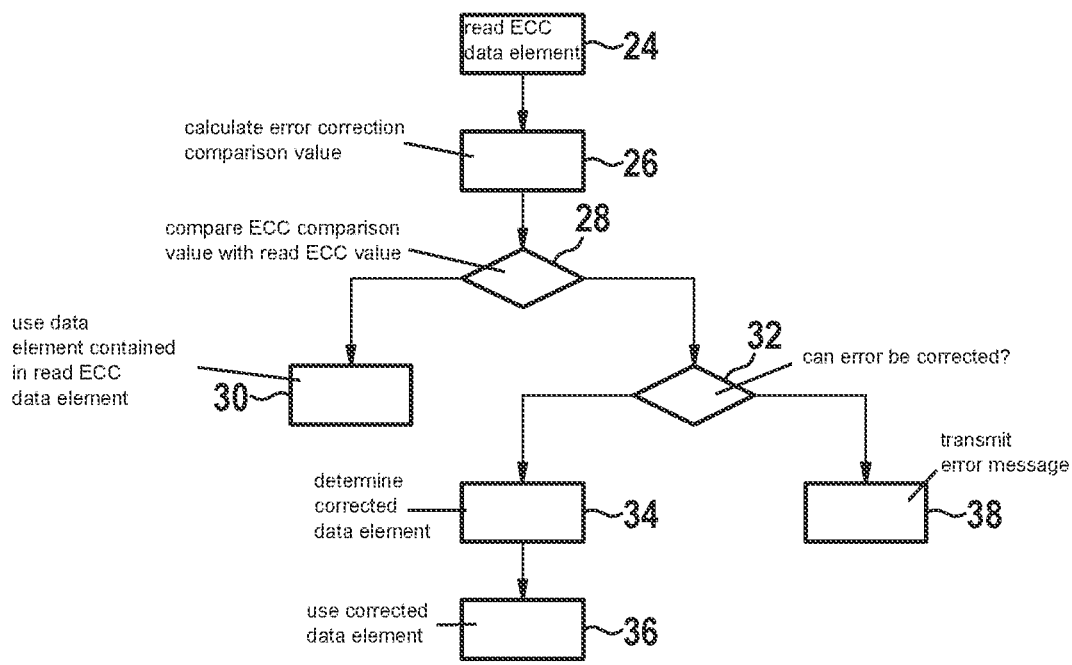

METHOD FOR THE SECURED STORING OF A DATA ELEMENT OF A PREDEFINED DATA TYPE TO BE STORED BY A COMPUTER PROGRAM IN AN EXTERNAL MEMORY

CROSS REFERENCE

The present application claims the benefit under 35 U.S.C. § 119 of German Patent Application No. DE 102020209132.3 filed on Jul. 21, 2020, which is expressly incorporated herein by reference in its entirety.

FIELD

The present invention relates to a method for the secured storing of a data element of a predefined data type to be stored by a computer program in an external memory and to a microcontroller and to a processing unit for carrying out the method.

BACKGROUND INFORMATION

In working memories such as SRAM, Flash, PCM or DRAM, it is possible, in addition to the data bits, to store further bits for correcting errors or identifying errors, referred to as "Error Correction Code," in order to secure the data content. Single bit errors or multi-bit errors within a data element may thus be identified and corrected as a function of the number of the bit errors within the data element.

In embedded systems, for example, control units of machines or vehicles, so-called microcontrollers are used which include, in addition to one or multiple processor cores, a particular limited amount of internal working memory, in which programs and data are stored during execution. For this working memory, in particular, for safety-critical applications, for example, in motor vehicles, an error correction method may be implemented in the microcontroller with the aid of ECC.

Typical SRAM memory cells used as working memories in microcontrollers include 6 transistors and are accordingly relatively expensive and complex to manufacture, hence, the working memory integrated in the microcontroller is frequently dimensioned only large enough to be sufficient for basic applications. An internal expandability of the working memory is usually not provided or is not possible in microcontrollers for reasons of cost, since the working memory is integrated with the processor cores in one chip.

In order to also enable the implementation of applications, which access a working memory larger than is provided on the microcontroller, it is possible to connect an external memory via a communication interface, for example, an SPI interface (Serial Peripheral Interface). This external working memory may be cost-efficiently designed in the form of DRAM memory cells that require only one transistor. However, no error correction function is implemented in available externally connectable working memories.

SUMMARY

According to the present invention, a method for the secured storing of a data element of a predefined data type to be stored by a computer program in an external memory and a microcontroller and a processing unit for carrying out the method are provided. Advantageous example embodiments of the present invention are disclosed herein.

According to an example embodiment of the present invention, a composite data element is defined during the creation of the computer program, which includes in each case one element of the predefined data type of the data element to be stored and one element of an error correction value data type, i.e., which, in particular, provides space for these elements. Here, the term "element" is intended to stand in general for a data element of a particular data type, for example, a data element to be stored or an error correction data element or a composite data element. During the program execution, one error correction data element each (hereinafter also ECC data element) is then formed as a compound data element from data elements to be stored and from calculated associated error correction values (hereinafter also ECC values). The ECC data elements thus formed are viewed as a unit when stored and thus written in each case to a particular memory address. This takes place within a single addressing phase so that neither do separate memory addresses have to be determined for the ECC values nor do multiple addressing phases have to be carried out for storing the data element and the ECC value. This enables a more rapid memory access as opposed to a storing of data elements and ECC values independently of one another.

"Addressing phase" is understood here to mean a memory access (writing or reading) in which, starting with a start address, a particular number of successive (i.e., to be stored or stored at successive addresses) bits (or bytes) is written or read. The start address is referred to as the memory address of the corresponding data.

An arbitrary suitable error correction method, for example, a Hamming code, may be used as an error correction method or error identification method for calculating the ECC value. Such methods are conventional to those skilled in the art. The error correction value data type is determined by the error correction method used.

The external memory connected via the interface module may be, in particular, a volatile memory, which is used by the microcontroller as a working memory, i.e., a DRAM memory (DRAM, Dynamic Random Access Memory). The application of the method in a non-volatile memory is also possible, however.

In accordance with an example embodiment of the present invention, the method preferably includes a read operation of the data element, the read operation including: reading the ECC data element stored at the memory address in which the data element is contained from the external memory, in order to obtain a read data element (the data element and the ECC value that are contained in a read ECC data element are referred to as read data element and read ECC value), calculating an ECC comparison value for the read data element, and comparing the ECC comparison value with the read ECC value. The read operation further preferably also includes: using the read data element if the ECC comparison value and the read ECC value are the same; or, using a data element corrected on the basis of the read data element and of the read ECC value if the ECC comparison value and the read ECC value are not the same. Using these method steps, memory errors occurring may be identified and, if necessary, corrected during reading.

As least the following two possibilities result for the calculation of the ECC values and/or of the ECC comparison values. The ECC value and/or the ECC comparison value is/are preferably calculated by a computer program module, which is designed in at least one processor core of the microcontroller. Alternatively or in addition, the ECC value and/or the ECC comparison value is/are calculated by an interface module, which is encompassed in the microcontroller. The interface module is designed as a hardware module of the microcontroller.

The first of these possibilities has the advantage that existing hardware, which includes no correspondingly configured interface module, may be used. In contrast, the second possibility has speed advantages since, in particular, no processor core of the microcontroller is loaded with the ECC calculations.

In accordance with an example embodiment of the present invention, the method preferably includes a determination of the memory address in the external memory for the error correction data element. In the determination of the memory address for the ECC data element, the memory space requirement for the data element and for the associated ECC value are taken into account, since the ECC data element is viewed as a unit with respect to the address determination. A determination of the memory address for the data element and for the associated ECC value and corresponding addressing phases are not necessary.

A microcontroller according to an example embodiment of the present invention is configured to carry out a method according to the present invention. The microcontroller preferably includes an interface module, which is configured to calculate ECC values and/or ECC comparison values for the data elements.

A processing unit according to an example embodiment of the present invention, for example, a control unit of a motor vehicle, includes a microcontroller according to the present invention and, preferably, an external memory, which is connected via the interface module to the microcontroller.

The present invention is suitable, in particular, for so-called "Embedded Systems." These are understood to mean electronic computers, which are integrated (embedded) into a technical context. The computer in this case assumes either monitoring, controlling or regulating functions or is responsible for a form of the data processing or signal processing, for example, during encryption and decryption, coding or decoding or filtering. A typical requirement of embedded systems is the real-time capability. A processing at an unpredictable processing speed may not be tolerated. Many applications (in particular, controllers in safety-relevant systems—i.e., systems, via which a human could be endangered, injured or even killed) require a system with a predictable reaction time.

The implementation of a method according to the present invention in the form of a computer program or computer program product including program code for carrying out all method steps is also advantageous, since this entails particularly low costs, in particular, if an executing control unit is also utilized for further tasks and therefore present in any case. Suitable data media for providing the computer program are, in particular, magnetic, optical and electrical memories such as, for example, hard disks, flash memories, EEPROMs, DVDs and the like. A download of a program via computer networks (Internet, Intranet, etc.) is also possible.

Further advantages and embodiments of the present invention result from the description herein and the figures.

The present invention is schematically represented in the figures based on exemplary embodiments and is described below with reference to the figures.

BRIEF DESCRIPTION OF THE DRAWINGS

FIG. 1A shows a flowchart of a write operation according to one preferred specific embodiment of the method for secured storing, in accordance with the present invention.

FIG. 1B shows a flowchart of a read operation according to one preferred specific embodiment of the method for secured storing, in accordance with the present invention.

DETAILED DESCRIPTION OF EXAMPLE EMBODIMENTS

Figure 2:
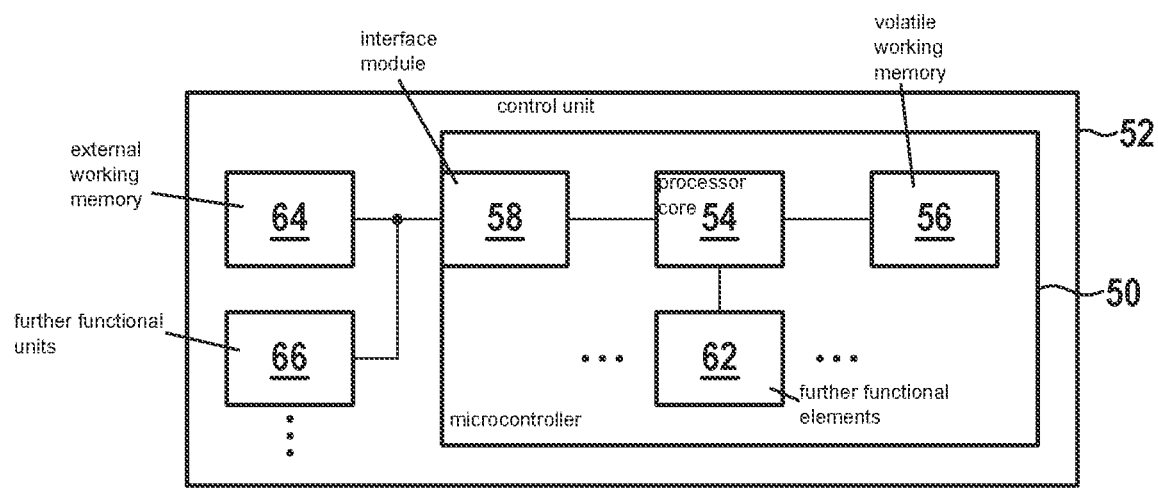
FIG. 2 shows a microcontroller, which may be preferably used for implementing the method according to the present invention.

FIG. 1A represents a flowchart of a write operation for the secured storing of data elements in an external memory connected to a microcontroller according to one preferred specific embodiment of the present invention. In the description below (also in the additional figures), reference is made, in particular, to a data element and to an ECC value and to an ECC data element, this reference is for the purpose of language simplification and is to be read as meaning at least one data element and at least one ECC value and at least one ECC data element. The present invention is therefore not restricted to one single data element.

The data element may be both program data, i.e., program instructions, as well as data that are used and, if necessary, changed by the computer program.

In a preparatory step 10, a composite data type or error correction data type (ECC data type) is initially defined. Error correction data elements (ECC data elements) of this ECC data type, i.e., composite data elements, are by definition formed from a data element of the data type (of the data elements to be stored) and from an associated error correction value (ECC value) of the error correction value data type, thus represent a composite data type. This step takes place during the programming of a computer program to be carried out by the microprocessor. A so-called structure ("struct") of the programming language C may be used here, for example.

In step 11, a composite data element is defined for each data element to be stored. Each composite data element includes one element of the data type of the data elements to be stored and one element of the error correction value data type. This and the potential step 10 take place during the creation of the computer program. The further steps, in which, in particular, an ECC data element is formed as a composite data element, then take place during the execution of the computer program.

An example of a composite data element defined as a structure of programming language C is as follows:

```
struct ecc_data
{
    uint64 data;
    uint8 ecc;
};
```

In this example, "ecc_data" stands for the composite data element or ECC data element, "data" stands for a data element to be stored of the data type "uint64" (for example, 64 bits) and "ecc" stands for an ECC value of the error correction value data type "uint8" (for example 8 bits). A corresponding composite data type or ECC data type may be implemented in the programming language C via a corresponding "typedef" definition. Besides 64-bit data elements and 8-bit ECC values, it is also possible, of course to use data elements and ECC values having longer lengths.

In step 12, a calculation of an ECC value for a data element to be stored takes place. This calculation may take place by an interface module, via which the external memory is connected to the microcontroller, and/or by a computer program module. The interface module and/or the computer program module is/are configured to calculate ECC values from data elements to be stored or from ECC comparison values of read data elements.

In step 14, an error correction data element (ECC data element) is formed from the data element to be stored and from the associated ECC value calculated in step 12, i.e., a composite data element (of the ECC data type, if defined) is formed, which includes the data element to be stored and the associated ECC value (for example, with the aid of a structure ("struct") of the programming language C).

In step 16, a memory address in the external memory is optionally determined for the ECC data element. This determination of the memory address takes the memory space requirement of the entire ECC data element into account, i.e., including data element and ECC value. Independent address calculations for the data element and the ECC value are not necessary. This step may take place (not shown) during the creation of the program, for example, by a linker and/or a locator or during the program execution, for instance, when memory space and memory addresses are dynamically reserved or determined (as shown) during the run time.

In step 18, the ECC data element is written to the particular memory address into the external memory. The data element and the ECC value, which are contained in the ECC data element, are thus written into the memory during a single addressing phase, i.e., the data element is written starting at one memory address and the ECC value is written immediately following the data element. An independent address calculation for the ECC value is therefore not necessary.

FIG. 1B represents a flowchart of a read operation according to one preferred specific embodiment of the method for the secured storing of data elements in an external memory.

If a previously stored data element is to be read, the ECC data element in which the data element is included is initially read from the external memory in step 24. Thus, the stored data element and the associated ECC value are read. This takes place again within a single addressing phase, a separate addressing phase for reading out the ECC value is not necessary.

In step 26, an error correction comparison value (ECC comparison value) is calculated from the data element contained in the read ECC data element, this may take place again by the interface module and/or by the computer program module. This ECC comparison value is compared in step 28 with the read ECC value, i.e., with the ECC value contained in the read ECC data element, which represents ECC value valid during the writing of the data element. In the comparison, it is established whether the data element has been changed, i.e., whether a memory error has occurred.

If the ECC comparison value is the same as the ECC value, i.e., if no memory error has occurred, the data element contained in the read ECC data element is used, step 30, for example, by a computer program, which is executed in at least one processor core of the microcontroller.

If the ECC comparison value is not the same as the ECC value, i.e., if a memory error has occurred, it is initially checked in step 32 whether the error may be corrected. Whether this is possible depends on the error correction method used, with which the ECC value is calculated. If, for example, an 8-bit long ECC value is used for a 64-bit long data element, typically 1-bit errors may be identified and corrected and 2-bit errors may be identified but not corrected.

If it is established that the error may be corrected, the error is corrected in step 34, i.e., a corrected data element is determined. The corrected data element is used in step 36, for example, by the computer program. If, on the other hand, it is established that the error may not be corrected, a corresponding error message is transmitted in step 38, for example, to the at least one processor core of the microcontroller or to the computer program executed therein.

FIG. 2 represents a microcontroller 50, which may be used to carry out the method according to the present invention. Microcontroller 50 is integrated here by way of example in a control unit 52, for example, of a motor vehicle or of a machine controller. Microcontroller 50 includes at least one processor core 54, a (internal) volatile working memory 56 (DRAM, Dynamic Random Access Memory) connected thereto and an interface module 58 also connected to processor core 54. "Connected" is to be understood here (and, thus nothing else is noted, within the scope of this application) as meaning a communication link for exchanging data, conductive connections are typically provided for this purpose, however, wireless connections (for example, radio or light) are also possible. The connections may be point-to-point connections or may be implemented via a bus; in each case serial or parallel communication may be provided. The three functional elements (processor core, working memory, interface) may be implemented as an integrated circuit in a single chip.

The at least one processor core 54 is configured to execute computer programs. The computer programs and data required and/or accruing during their execution are stored in working memory 56. Interface module 58 is used for the exchange of data between microcontroller 50 and external devices or functional units. Interface module 58 may include a serial or parallel interface, for example, an SPI interface (SPI, Serial Peripheral Interface, originally introduced by Motorola) or a refinement of the same. Interface module 58 is designed as a hardware module and is used in the error correction method.

The microcontroller may include further functional elements 62 connected to the processor core, for example, a non-volatile memory (for example, flash memory) or further interfaces (for example, a CAN bus interface). Further connections not shown between the individual functional elements may also be provided, for example, a direct connection between working memory 56 and interface module 58.

Also represented in FIG. 2 is an external working memory 64 not included in the microcontroller, which is connected to interface module 58. Further functional units 66 may also be connected via interface module 58 or via further interfaces to microcontroller 58 (in addition or alternatively to corresponding functional elements 62 in the microcontroller). Examples are again a non-volatile memory or further interfaces (for example, a CAN bus interface for communication between the control unit and other elements of the device that is controlled by the control unit).

The working memory, which microcontroller 50 or its processor core 54 is able to access, may be expanded by external (volatile) working memory 64. Thus, programs may be stored at least partially in the external working memory during execution, for example, if the programs are too large for internal working memory 56. Although the access to external working memory 64 is generally slower than to internal working memory 56, the access is still significantly faster however than the access to a non-volatile memory, for example, a flash memory, in which the programs are permanently stored.

Memory accesses to external working memory 64 take place via interface module 58. The interface module 58 may be configured to calculate ECC values for data elements, which are contained in ECC data elements to be written or to be read. If interface module 58 is accordingly configured, an associated error correction value (ECC value), which together with the data element forms the ECC data element that is to be stored in the external working memory, is calculated for the data element contained in the ECC data element by interface module 58 in a write access, in which an ECC data element is to be stored. Alternatively or in addition to the calculation of the ECC values by an interface module, a calculation of the ECC values may take place via a corresponding module implemented as software, i.e., by a computer program module.

Since the ECC data element represents a composite data type, which is written as one unit to the memory address, the ECC value, when written, is written immediately following the data element. An independent address calculation for the ECC memory address, i.e., the memory address to which the ECC value is written, is therefore not necessary. In addition to the omission of an independent address calculation for the ECC value, it is also advantageous that the writing and, if necessary, the later reading of the ECC data element and of the associated ECC value may be carried out normally within one burst access of the external working memory. A so-called "Burst Mode" is implemented in ordinary DRAM memories that are used as working memories, in this case, data stored in a memory row are written or read in direct succession so that the provision of further data contained in a memory row requires very little time as opposed to the provision of the first data contained in the memory row, since the memory row does not have to be reactivated (typical row lengths are 512 bytes, 1 Kbyte, 2 Kbytes).

Figure 3:
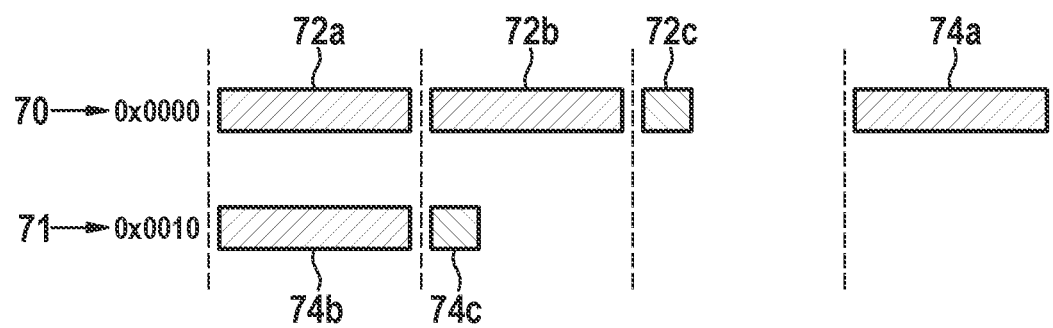
FIG. 3 shows an example of the arrangement of two ECC data elements, each including a data element and an associated ECC value, as it is achieved by an example embodiment of the present invention.

FIG. 3 represents by way of example the arrangement of two data elements, each of which includes a data element and the associated ECC value, as they are obtained by the present invention in the external working memory. Further ECC data elements not shown may of course also be stored in the memory. In this case, 64-bit data elements and 8-bit ECC values are shown by way of example. In contrast to this example, the data elements and the ECC values may in general have an arbitrary length. For example, the data elements may have a length of 8, 16, 32, 64, 128 bits, to name a few typical values. Similarly, the ECC values may also have other lengths, for example, 4, 8 or 16 bits, this depends on the ECC method used and may depend on the length of the data elements (for example, 8-bit data element length for each 1-bit ECC value length) or may also be independent thereof. A length of the ECC value of, for example, 8 bits (or of another invariably the same length) may also always be provided; typical combinations are then 8-bit data element+8-bit ECC value, 16-bit data element+8-bit ECC value, 32-bit data element+8-bit ECC value and 64-bit data element+8-bit ECC value.

Two successive memory sections 70, 71 are shown in FIG. 3, which start at hexadecimal addresses 0x0000 and 0x0010, each address corresponding to one-byte (8 bits) and 4-byte sections each, i.e., 32-bit sections, being indicated by dashed lines. Two ECC data elements 72a through c, 74a through c are stored, each of which includes a 64-bit data element 72a, 72b, 74a, 74b and associated ECC value 72c, 74c. First ECC data element 72a, 72b, 72c, which includes a first data element 72a, 72b and a first ECC value 72c is stored starting at address 0x0000, the 64 bits of the first data element being plotted as two 32-bit elements 72a, 72b and first ECC value 72c belonging to the first data element. First ECC value 72c immediately follows first data element 72a, 72b, i.e., starting at memory address 0x0008. The ECC value may have a length of 8 bits, for example.

Second ECC data element 74a, 74b, 74c, which includes a second data element 74a, 74b and an associated ECC value 74c, starts in this example at memory address 0x000C. The second data element again includes two 32-bit elements 74a, 74b, which together form the 64-bit data element to be stored. It should be noted here that 32-bit elements in this example are aligned with 32-bit sections in the working memory. If the ECC value is shorter than 32-bit, a section in the memory accordingly remains open (in the case of an 8-bit ECC value, for example, the section from 0x0009 through 0x000B remains open). Second ECC value 74c belonging to the second data element is stored immediately after second data element 74a, 74b, i.e., at memory address 0x0014.

This arrangement is conditioned by the definition of the composite data type, whose ECC data elements by definition each include one data element (here, a 64-bit data element) and the associated ECC value. The ECC data elements may each be accessed using merely the respective memory addresses (0x0000 and 0x000C in the example of FIG. 3). This means, data element and associated ECC value form a composite data element, which may be addressed with the aid of a single memory address, and may thus be written or read in a single addressing phase. An ECC data element, with a data element length of 64 bits and an ECC value length of 8 bits, for example, has a length of 72 bits, which is accessed in a shared addressing phase. An addressing phase relating to the first data element would involve here, for example, the 9 bytes (72 bits=64-bit data element+8-bit ECC value) of the first ECC data element, starting at memory address 0x0000, i.e., the addresses 0x0000 to and including 0x0008.

What is claimed is:

1. A method for secured storing of a data element of a predefined data type to be stored by a computer program in an external memory, which is connected to a microcontroller, an error correction value of an error correction value data type being used, the method comprising:
   defining, when creating the computer program, a composite data element, which includes one element of the predefined data type and one element of the error correction value data type, in the computer program; and
   when executing the computer program:
   calculating the error correction value for the data element to be stored,
   forming an error correction data element as the composite data element, which contains the data element to be stored and the error correction value which has been calculated for the data element, and
   writing the error correction data element to a memory address for the error correction data element, wherein the data element and the error correction value of the composite data element are accessible by a single addressing phase that encompasses a number of successive bits that is at least equal to a sum of a number of bits of the data element and a number of bits of the error correction value.

2. The method as recited in claim 1, further comprising a read operation of the data element, the read operation including:
   reading the error correction data element stored at the memory address in which the data element is contained, from the external memory, in order to obtain a read data element and a read error correction value;
   calculating an error correction comparison value for the read data element; and
   comparing the error correction comparison value with the read error correction value.

3. The method as recited in claim 2, wherein the read operation further includes:
   using the read data element when the error correction comparison value and the read error correction value are the same; and
   using a data element corrected based on the read data element and the read error correction value when the error correction comparison value and the read error correction value are not the same.

4. The method as recited in claim 1, wherein at least one of the error correction value and the error correction comparison value is calculated by a computer program module which is executed in a processor core of the microcontroller.

5. The method as recited in claim 1, wherein at least one of the error correction value and the error correction comparison value is calculated by an interface module disposed between the external memory and the microcontroller.

6. The method as recited in claim 1, further comprising:
   determining the memory address in the external memory for the error correction data element.

7. A microcontroller configured for secured storing of a data element of a predefined data type to be stored by a computer program in an external memory, which is connected to a microcontroller, an error correction value of an error correction value data type being used, wherein, when creating the computer program, a composite data element is defined which includes one element of the predefined data type and one element of the error correction value data type, in the computer program, and wherein the microcontroller is configured to:
   when executing the computer program:
      calculate the error correction value for the data element to be stored,
      form an error correction data element as the composite data element, which contains the data element to be stored and the error correction value which has been calculated for the data element, and
      write the error correction data element to a memory address for the error correction data element, wherein the data element and the error correction value of the composite data element are accessible by a single addressing phase that encompasses a number of successive bits that is at least equal to a sum of a number of bits of the data element and a number of bits of the error correction value.

8. The microcontroller as recited in claim 7, wherein the microcontroller includes an interface module for interfacing with an external memory and which is configured to calculate at least one of error correction values and error correction comparison values for data elements, and the microcontroller is configured to perform a read operation of the data element, the read operation including:
   reading the error correction data element stored at the memory address in which the data element is contained, from the external memory, in order to obtain a read data element and a read error correction value;
   calculating an error correction comparison value for the read data element; and
   comparing the error correction comparison value with the read error correction value.

9. A processing unit, comprising:
   an external memory; and
   a microcontroller configured for secured storing of a data element of a predefined data type to be stored by a computer program in the external memory, which is connected to a microcontroller, an error correction value of an error correction value data type being used, wherein, when creating the computer program, a composite data element is defined which includes one element of the predefined data type and one element of the error correction value data type, in the computer program, and wherein the microcontroller is configured to:
   when executing the computer program:
      calculate the error correction value for the data element to be stored,
      form an error correction data element as the composite data element, which contains the data element to be stored and the error correction value which has been calculated for the data element, and
      write the error correction data element to a memory address of the external memory for the error correction data element, wherein the data element and the error correction value of the composite data element are accessible by a single addressing phase that encompasses a number of successive bits that is at least equal to a sum of a number of bits of the data element and a number of bits of the error correction value.

* * * * *